(12) United States Patent
Kang

(10) Patent No.: US 6,850,428 B2
(45) Date of Patent: Feb. 1, 2005

(54) LOW VOLTAGE DETECTOR AND METHOD FOR DETECTING LOW VOLTAGE OF FERAM, AND SYSTEM USING THE SAME

(75) Inventor: Hee Bok Kang, Daejeon (KR)

(73) Assignee: Hynix Semiconductor, Inc., Ichon-shi (KR)

(*) Notice: Subject to any disclaimer, the term of this patent is extended or adjusted under 35 U.S.C. 154(b) by 156 days.

(21) Appl. No.: 10/331,589

(22) Filed: Dec. 31, 2002

(65) Prior Publication Data
US 2004/0042253 A1 Mar. 4, 2004

(30) Foreign Application Priority Data
Aug. 30, 2002 (KR) .................. 10-2002-0051934

(51) Int. Cl.[7] ............................................. G11C 11/22
(52) U.S. Cl. .................................. 365/145; 365/226
(58) Field of Search .................. 365/145, 226, 365/191

(56) References Cited

U.S. PATENT DOCUMENTS 5,574,679 A * 11/1996 Ohtsuki et al. .............. 365/145
6,201,731 B1 * 3/2001 Kamp et al. ........... 365/185.02

* cited by examiner

Primary Examiner—Anh Phung
(74) Attorney, Agent, or Firm—Jacobson Holman PLLC

(57) ABSTRACT

A low voltage detector and method of detecting low voltage of a nonvolatile memory chip is disclosed wherein a memory cell does not operate in a low voltage and definitly discriminate activation and deactivation voltage area of the chip by synchronizing operation start and stop points of a FeRAM cell to a chip enable signal according to variation of system power for safely operating the chip in threshold voltage region. In this way, because the chip safely operates even the threshold voltage region such as the on/off states of power voltage, the chip can be protected even at the on/off states of power voltage and the layout area of the chip becomes efficient without having additional circuits.

19 Claims, 13 Drawing Sheets

LOW VOLTAGE DETECTOR AND METHOD FOR DETECTING LOW VOLTAGE OF FERAM, AND SYSTEM USING THE SAME

BACKGROUND OF THE INVENTION

1. Field of the Invention

The present disclosure generally relates to FeRAM devices, and more particularly, to a low voltage detector and method for detecting low voltage of nonvolatile ferroelectric random access memory (hereinafter, referred to as 'FeRAM') chips which secures safe memory cell operation in threshold voltage regions by synchronizing start and stop operation of FeRAM cells to chip activation signals.

2. Description of the Background Art

Generally, a FeRAM has the same data processing speed as a dynamic random access memory (DRAM) and retains data even when power is off. For this characteristic, the FeRAM has been highly regarded as a next generation memory device.

The FeRAM has structures similar to those of a DRAM, and uses ferroelectric material as a component of a capacitor. The FeRAM uses high residual polarization, which is a characteristic of ferroelectric material, by using.

Due to the high residual polarization, data remains unerased even if the electric field is removed.

FIG. 1 illustrates a hysteresis loop of a general ferroelectric.

As shown in FIG. 1, polarization induced by the electric field is maintained at a certain amount (i.e., "d" and "a" states) due to the presence of residual polarization (or spontaneous polarization), even if the electric field is removed.

A FeRAM cell may be used as a memory device by corresponding the "d" and "a" states to 1 and 0, respectively. FIG. 2 illustrates a unit cell of a conventional FeRAM device.

As shown in FIG. 2, the unit cell of the conventional FeRAM device includes a bitline B/L formed in one direction, a wordline W/L formed to cross bitline B/L and a plateline P/L arranged parallel to the wordline and spaced at a predetermined interval from the wordline W/L. The unit cell also includes a NMOS transistor having a gate terminal connected to the wordline W/L and a source terminal connected to the bitline B/L, and a ferroelectric capacitor FC1 connected between the drain terminal of the NMOS transistor and the plateline P/L.

The data input/output operation of the conventional FeRAM device is now described as follows.

FIG. 3A is a timing chart illustrating a write mode operation of a general FeRAM device, and FIG. 3B is a timing chart illustrating a read mode operation of a general FeRAM device.

Referring to FIG. 3A, if an externally applied chip enable signal CSBPAD is activated from 'high' to 'low', a write enable signal is transited from 'high' to 'low', and the writing mode starts.

Subsequently, if an address is decoded starts in the write mode, the corresponding wordline W/L transits from 'low' to 'high' to select the cell.

During the interval wherein the wordline W/L maintains a 'high' state, a 'high' signal of a predetermined period and a 'low' signal of a predetermined period are selectively applied to a corresponding plateline P/L. In order to write binary logic values '1' or '0' in the selected cell, 'high' or 'low' signals synchronized to the write enable signal WEBPAD are applied to a corresponding bitline B/L.

As shown in the following Table 1, during the period wherein a 'high' signal is applied to a wordline W/L, when a 'high' signal is applied to the bitline B/L and a 'low' signal is applied to the plateline P/L, a logic value '1' is written in the ferroelectric capacitor FC1. When a 'low' signal is applied to the bitline B/L and a 'high' signal is applied to the plateline P/L, a logic value '0' is written in the ferroelectric capacitor FC1.

TABLE 1

|  |  | P/L | |
| --- | --- | --- | --- |
|  | W/L:H | H | L |
| B/L | H | X | 1 |
|  | L | 0 | X |

Referring to FIG. 3B, If an externally applied chip enable signal CSBPAD is activated from 'high' to 'low', all of the bitlines become equipotential to low voltage by an equalizer signal before a corresponding wordline is selected. Then, after each bitline becomes inactive, an address is decoded. A wordline corresponding to the decoded address is transited from the low signal to the high signal, to enable a selected cell.

A 'high' signal is applied to a corresponding plateline of the selected cell to destroy a data Qs corresponding to a logic value '1' stored in the ferroelectric memory cell. If a logic value '0' is stored in the ferroelectric memory cell, its corresponding data Qns is not destroyed.

The destroyed data or the non-destroyed data is outputted to bitlines, according to the above-described hysteresis loop characteristics, so that a sense amplifier senses logic values '1' or '0'.

In other words, as shown in the hysteresis loop of FIG. 1, the state moves from the 'd' to 'f' when the data is destroyed while the state moves from 'a' to 'f' when the data is not destroyed. The logic value '1' is output in case the data is destroyed, while the logic value '0' is output in case the data is not destroyed.

After the sense amplifier amplifies the data, the data should be recovered into the original data. Accordingly, the plateline P/L becomes inactive from 'high' to 'low' during the interval where the 'high' signal is applied to the corresponding wordline W/L.

In a system using the above-described FeRAM, a system controller outputs a chip enable signal CSBPAD as a control signal into a FeRAM chip. A memory device in the memory chip generates a chip internal control signal CICS for operating a memory cell of a chip according to the chip enable signal CSBPAD to read/write data from/to the memory. The data is transferred to system controller via a data bus.

In the system using the nonvolatile memory, the system controller may have an operation voltage different from that of the FeRAM device.

When the system controller has the operation voltage lower than that of the FeRAM device, the system controller may generate a normal control signal and output it into the memory device, even through power voltage abnormally drops. In this case, the FeRAM device may not operate normally while the system controller operates normally. In the FeRAM device, data is read by destroying data stored in a cell. When the power voltage abnormally drops, the destroyed data in the read operation may not be recovered, by the read cycle is finished.

Accordingly, methods for conserving data during the read operation have been required in the FeRAM device. For the method for conserving data, a method using a low voltage detection circuit is provided.

FIG. 4 is a low voltage detection circuit diagram showing a conventional FeRAM device.

The low voltage detection circuit comprises a PMOS transistor T1, a NMOS transistor T2, a NMOS transistor T3 and a PMOS transistor T4. The PMOS transistor T1 and the NMOS transistor T2 are in series connected between a power voltage VCC and a ground voltage VSS, and have a common gate. The NMOS transistor T3 connected between a node A and a ground voltage VSS is controlled by output voltage of the PMOS transistor T1. The PMOS transistor T4 is connected between the node A and the power voltage VCC and has a gate terminal connected to the ground voltage VSS.

Additionally, the low voltage detection circuit comprises a first inverter INV1 for inverting an output voltage of the NMOS transistor T3, a second inverter INV2 for inverting an output signal of the first inverter INV1 and a third inverter INV3 for inverting an output signal of the second inverter INV2 to output a first output signal PONF1.

Further, the low voltage detection circuit comprises a fourth inverter INV4, connected in parallel to the first inverter INV1, for inverting an output voltage of the NMOS transistor T3, a fifth inverter INV5 for inverting an output signal of the fourth inverter INV4, a PMOS transistor T5 controlled by an output signal of the fifth inverter INV5 and connected between a power voltage terminal and an output terminal of the fourth inverter INV4, and a sixth inverter INV6 for inverting an output signal of the fifth inverter INV5 to output a second output signal PONF2.

FIG. 5 is a timing diagram showing relations between a chip enable signal CSBPAD applied externally and a control signal of an internal FeRAM device (chip internal control signal CICS) when a power voltage VCC falls from a normal voltage to a low voltage.

FIG. 6 is a timing diagram showing relations between the chip enable signal CSBPAD and the chip internal control signal CICS when the power voltage VCC rises from the low voltage to the normal voltage.

As shown in FIG. 5, when the power voltage falls below a predetermined level, the low voltage detection circuit senses the of the to a low level.

A predetermined period Twb is passed after the first output signal PONF1 is transited to the low level, and then the low voltage detection circuit transits a second output signal PONF2 to the low level.

According to combination of the first output signal PONF1 and the second output signal PONF2, the chip internal control signal CICS is maintained at the high level for a predetermined period Twb from a detection point of low voltage, and then is transited to the low level.

This operation is performed to secure a period for recovering data when the power voltage VCC falls at a low level.

On the other hand, as shown in FIG. 6, when the power voltage VCC rises over the predetermined level, the low voltage detection circuit senses the voltage variation and transits both a first output signal PONF1 and a second output signal PONF2 from a low to a high level.

Referring to FIG. 6, the chip internal control signal CICS is transited to a high level as soon as the power voltage VCC rises over the predetermined level. Accordingly, a normal read cycle waveform is not generated.

In order to prevent the problem, there may be a method of delaying one of the two output signals PONF1 or PONF2 may be delayed lest the first output signal PONF1 and the second output signal PONF2 should be transited simultaneously. However, according to the method, a corresponding cycle may be delayed to affect a system operation. As a result, the above-described problems may not be solved by delaying a signal of two output signals PONF1 and PONF2.

The conventional low voltage detection circuit generates output signals PONF1 and PONF2 by using a voltage level of power voltage VCC regardless of an externally applied chip enable signal CSBPAD.

Here, a read cycle may be fully secured to recover the destroyed data when the power voltage falls from the normal to the low voltage. Accordingly, when the power voltage rises the low voltage to the normal voltage, the read cycle has an abnormal cycle time and moves to the next cycle without recovering the destroyed data during the read operation. As a result, the destroyed data may not be safely recovered.

SUMMARY OF THE DISCLOSURE

Accordingly, it is an object of the present disclosure to provide a FeRAM device which secures safe FeRAM cell operation in threshold voltage regions by synchronizing start and stop operation of FeRAM cells according to variation of power voltage to chip activation signals CE (inverted signals of external chip enable signals CSBPAD). According to the present invention the FeRAM cells do not operate in a low voltage and chip enable and disable voltage regions are definitely discriminated in a normal voltage.

It is another object of the present disclosure to provide a FeRAM device which secures safe FeRAM cell operation by generating resetbar signals of new waveforms to fix a chip internal control signal CICS at a low level during the initial operation of FeRAM cell regardless of state of chip enable signals.

The low voltage detector for detecting low voltage of FeRAM chips includes: a reset circuit for outputting a resetbar signal maintained at a low level to a predetermined level of power voltage when power voltage rises from the low voltage to the normal voltage, and maintained at the high level when power voltage is in a normal voltage or falls from the normal to a predetermined level of voltage; and a low voltage detecting synchronization circuit for synchronizing operation start and stop points of FeRAM cell to chip enable signals by detecting variation in the resetbar signal and power voltage. The low voltage detector for detecting low voltage of FeRAM chips fixes a chip internal control signal at the low level regardless of change in chip enable signals by using an external resetbar signal before power voltage reaches a threshold value for operation start of FeRAM cells to forcibly disable the FeRAM cell.

There is also provided a method for detecting low voltage of FeRAM chips by using resetbar signals maintained at a low level to a predetermined level of power voltage when a power voltage rises the low voltage to the normal voltage and maintained at the high level dependent upon type of power voltage when power voltage is in the normal voltage or falls from the normal voltage to the predetermined level of voltage, to synchronize operation start and stop points of FeRAM cells to chip enable signals according to variation of power voltage by using the resetbar signals.

The method for detecting low voltage of FeRAM chips is to fix a chip internal control signal at low level regardless of change in chip enable signals by using an external resetbar signal before power voltage reaches a threshold value for operation start of FeRAM cells to forcibly disable the FeRAM cell.

DETAILED DESCRIPTION OF THE PREFERRED EMBODIMENTS

The preferred embodiments of the present disclosure will be described in more detail referring to the accompanying drawings.

Figure 1:
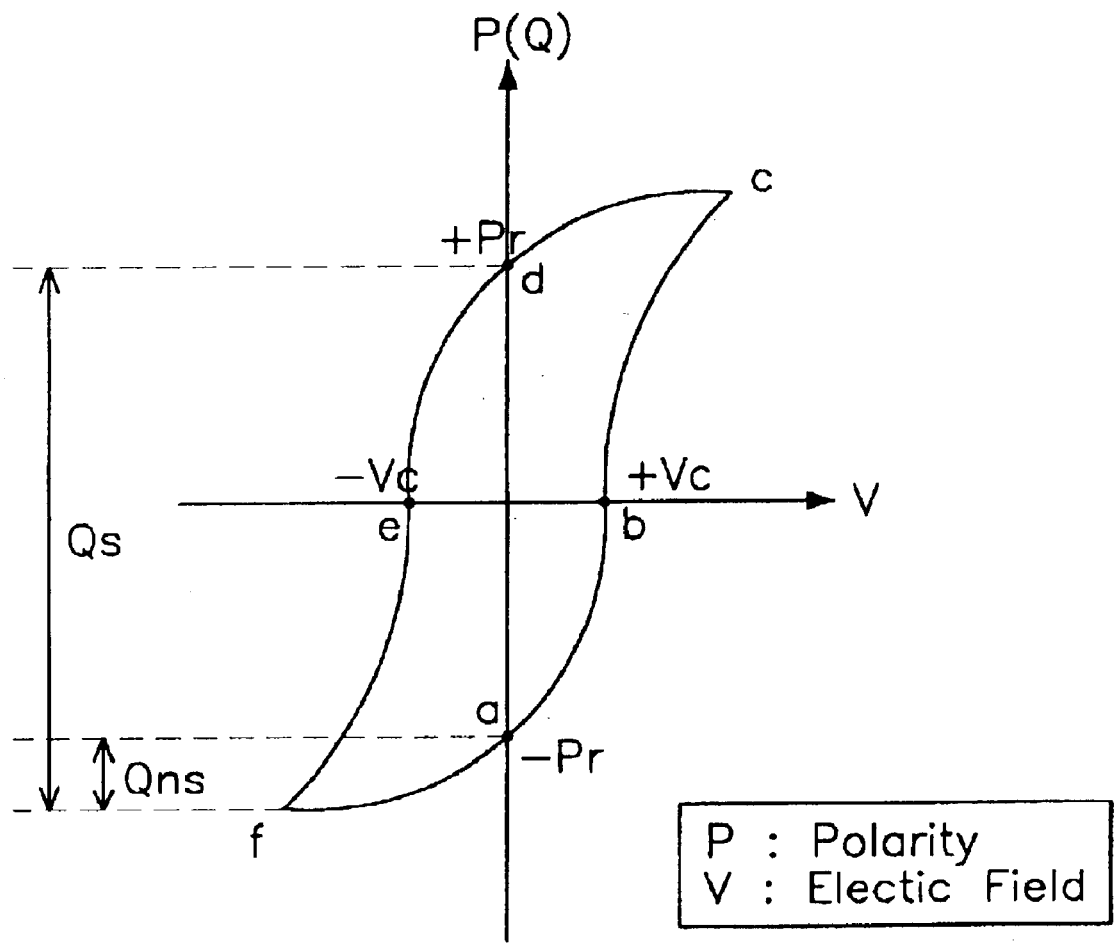
FIG. 1 is a characteristic curve showing a hysteresis loop of a general ferroelectric material.
Figure 2:
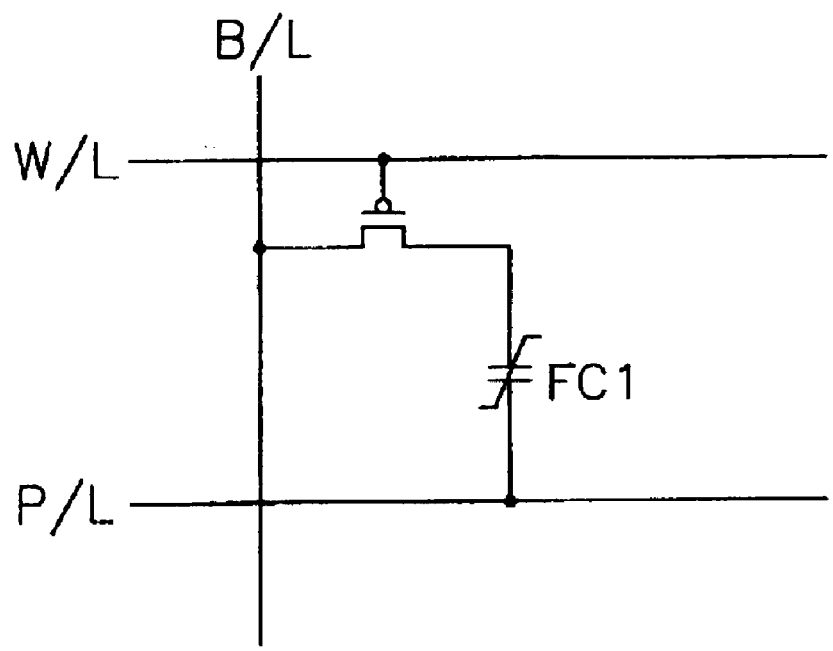
FIG. 2 is a structural diagram showing a unit cell in a general FeRAM device.
Figure 3A:
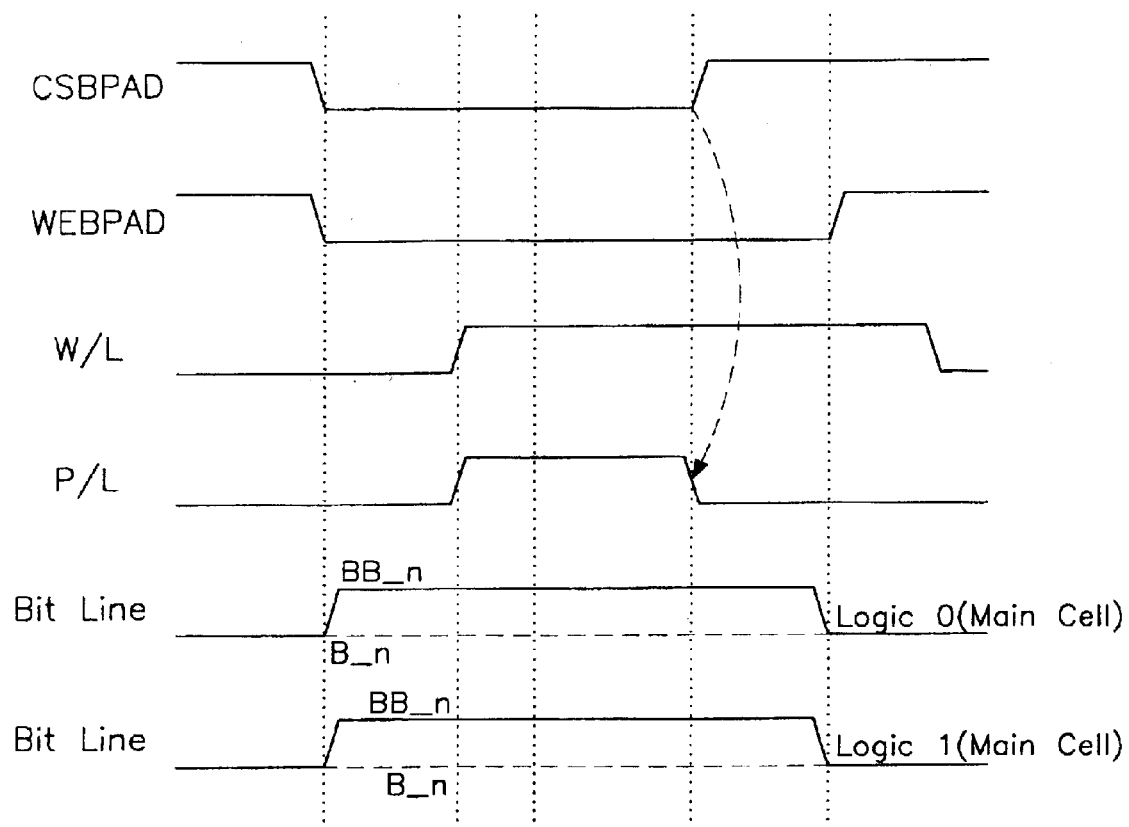
FIG. 3a is a timing chart showing a write mode operation of a general FeRAM device.
Figure 3B:
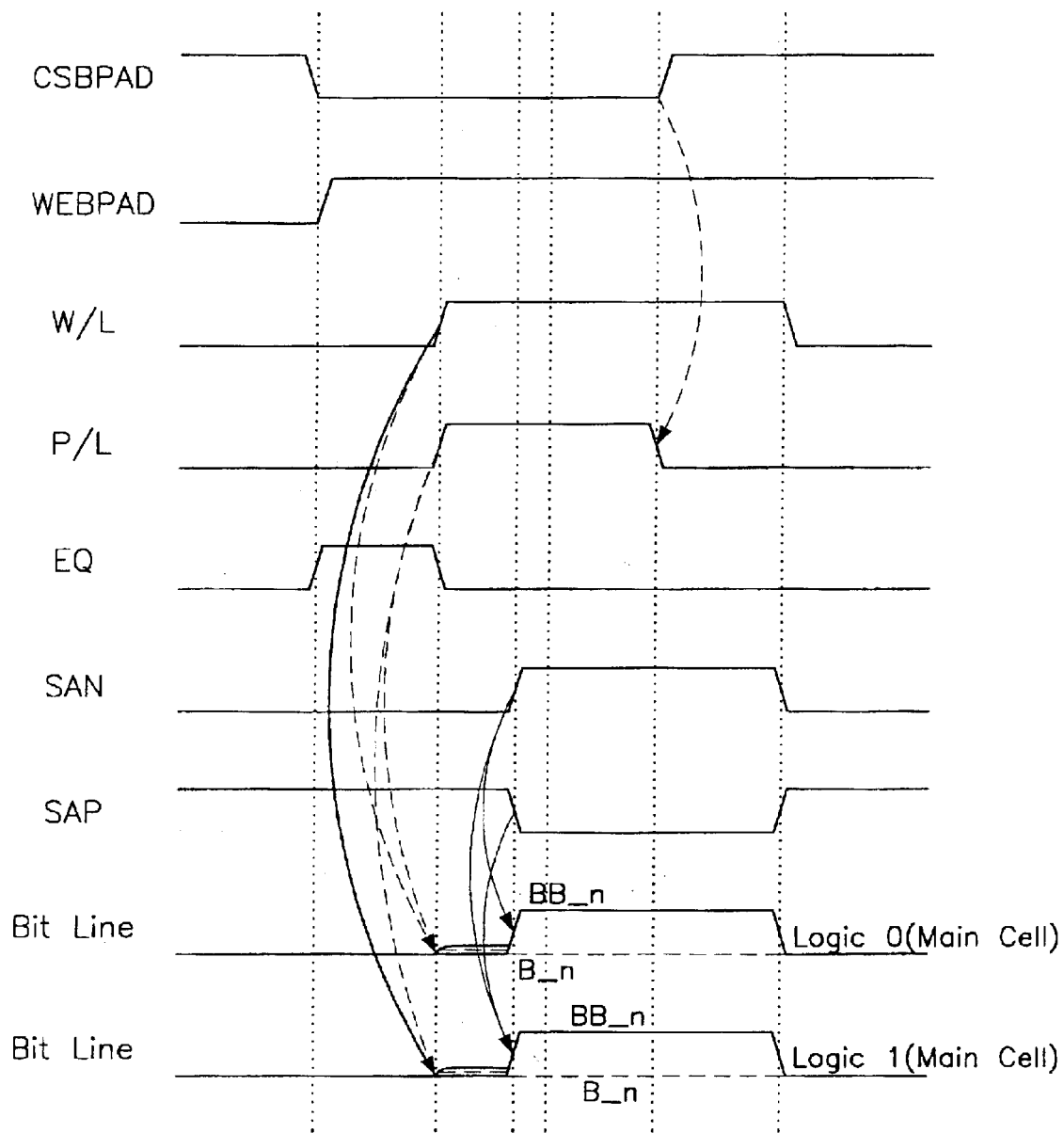
FIG. 3b is a timing chart showing a read mode operation of a general FeRAM device.
Figure 4:
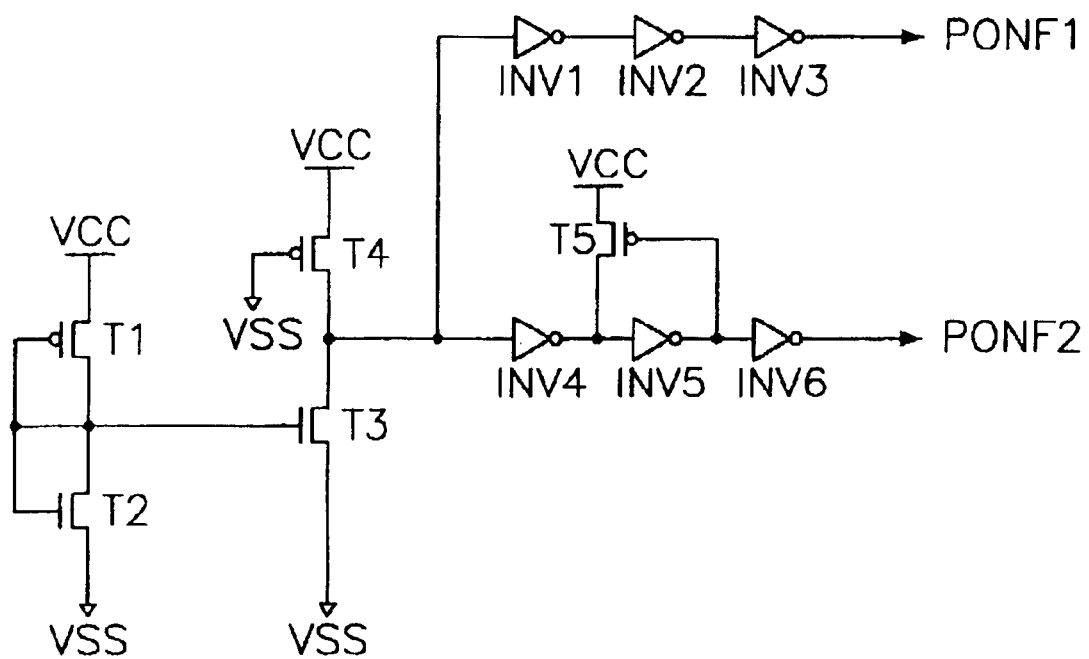
FIG. 4 is a driving circuit diagram showing a conventional FeRAM device.
Figure 5:
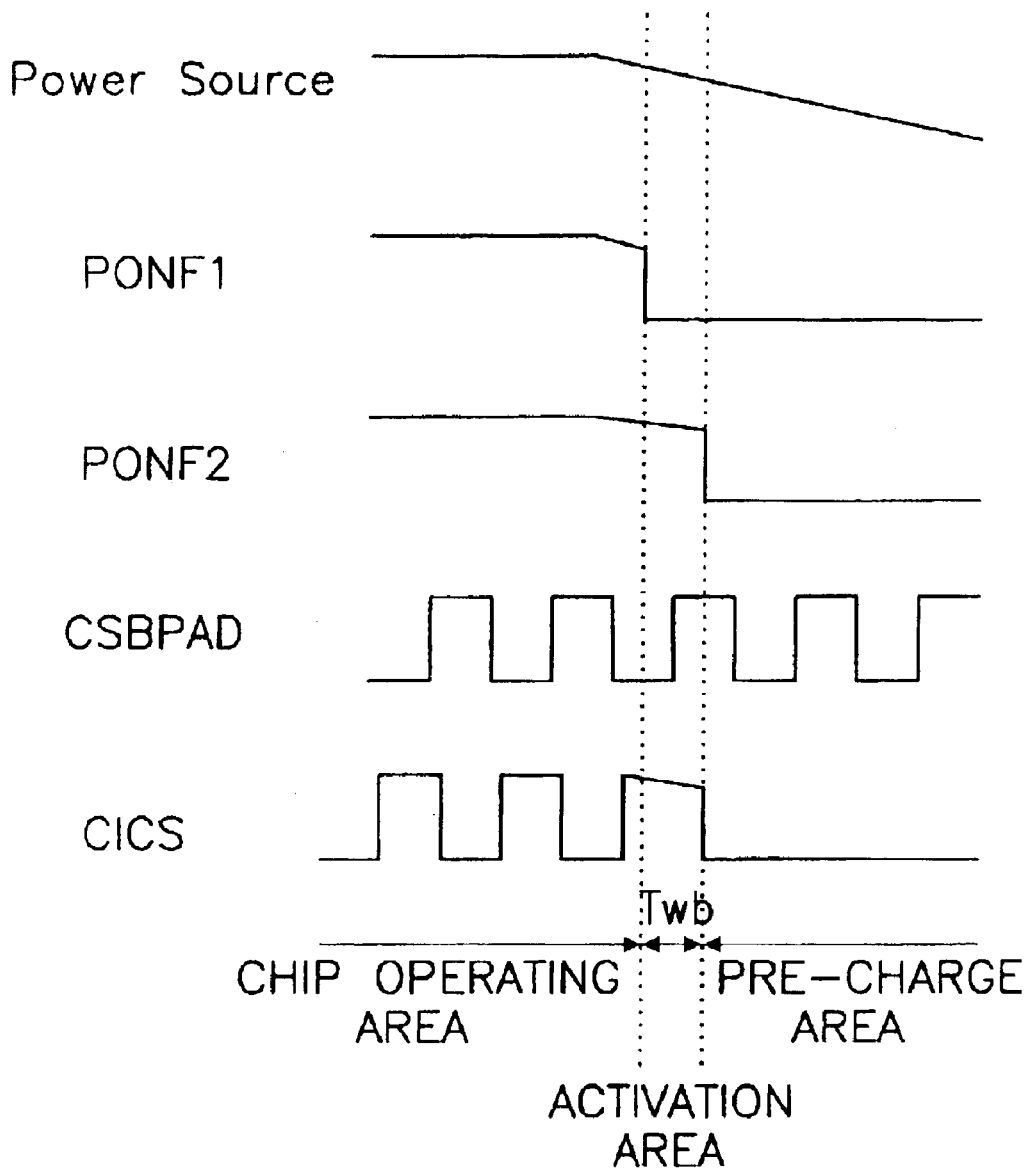
FIGS. 5 and 6 are diagrams showing operation waveforms of the memory device of FIG. 4.
Figure 6:
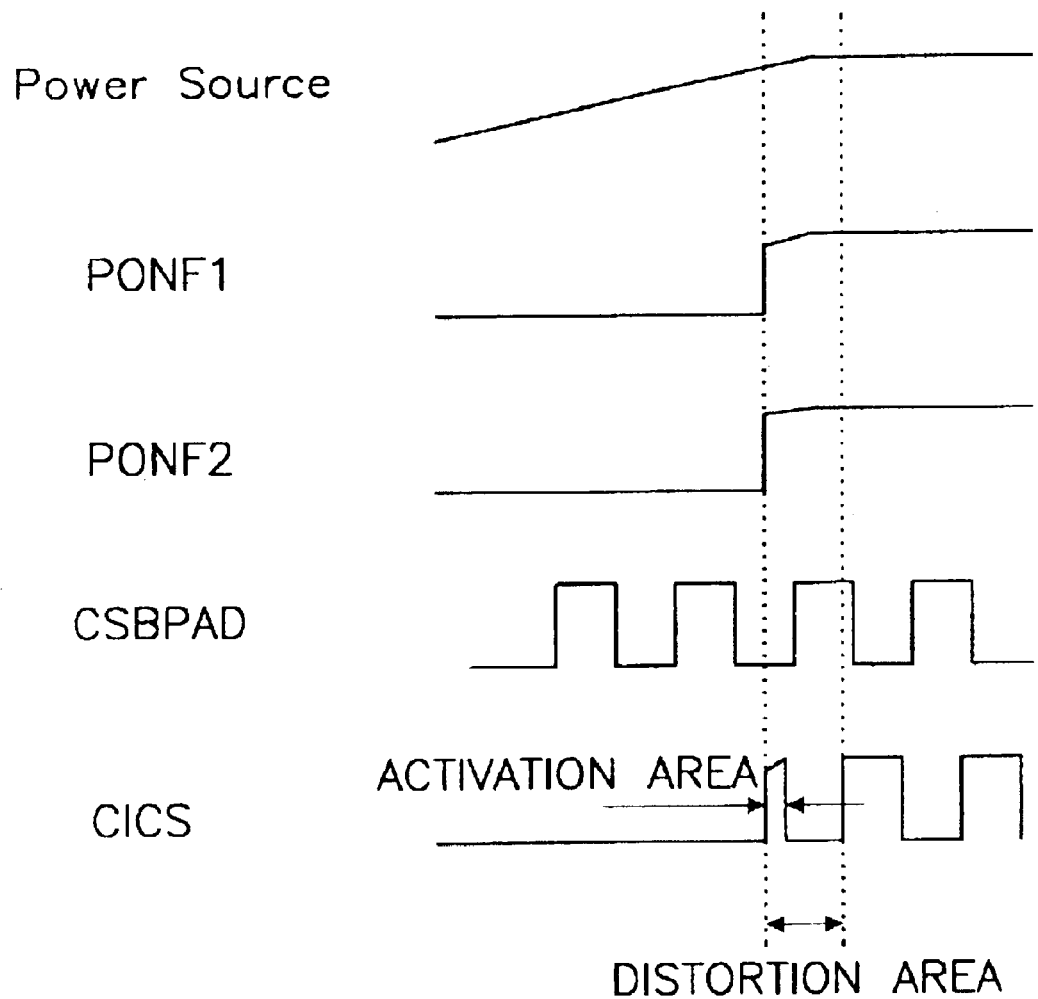
Figure 7:
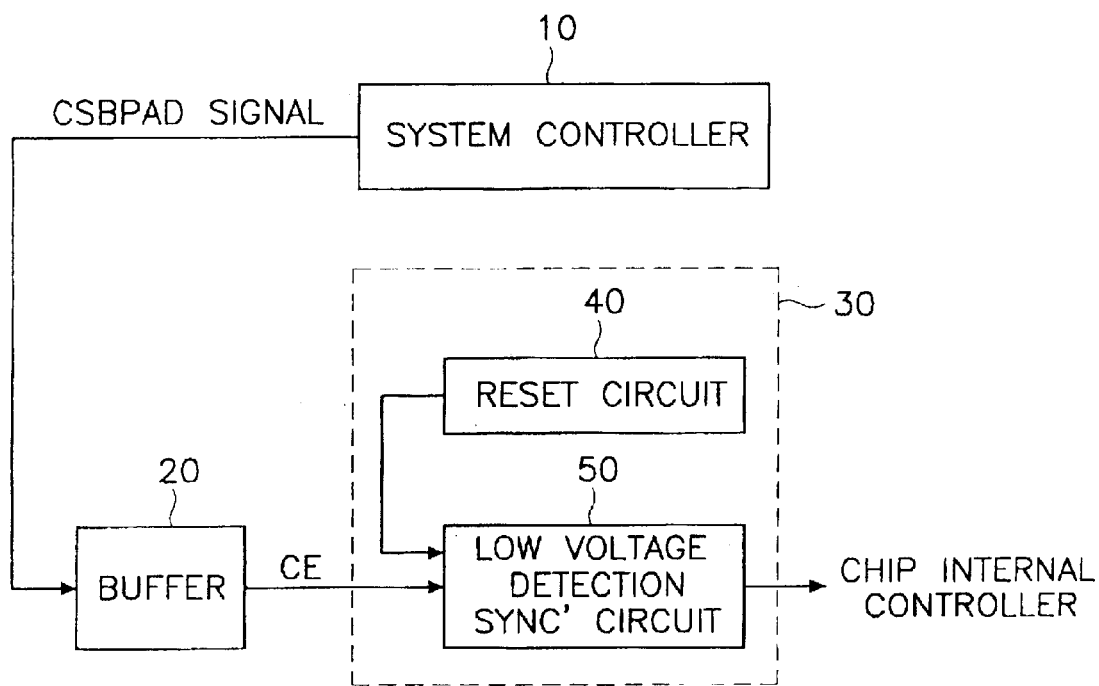
FIG. 7 is a block diagram showing a low voltage detecting system using the FeRAM driving device in accordance with a preferred embodiment of the present disclosure.

FIG. 7 is a block diagram showing a low voltage detecting system using the FeRAM driving device in accordance with a preferred embodiment of the present disclosure.

A system controller 10 outputs a chip enable signal CSBPAD for writing data or reading the written data in a FeRAM to operate a system.

A buffer 20 buffers the chip enable signal CSBPAD and outputs a chip activation signal CE, the inverted signal of the chip enable signal CSBPAD.

A memory cell driving device 30 senses the variation of power voltage and then generates a chip internal control signal CICS for synchronizing operation of a FeRAM cell to the chip activation signal CE in a normal voltage region.

The memory cell driving device 30 comprises a reset circuit 40 and a low voltage detecting synchronization circuit 50. The reset circuit 40 outputs a resetbar signal RESETB maintained at a low level until the power voltage VCC reaches a predetermined level when power voltage VCC rises from the low voltage to the normal voltage. And the resetbar signal RESETB is maintained at a high level when power voltage VCC is at the normal voltage or falls from the normal voltage to the predetermined level. The low voltage detecting synchronization circuit 50 senses the variation of power voltage and synchronizes start and stop operation of the FeRAM cell to the chip activation signal by using the resetbar signal RESETB.

Figure 8:
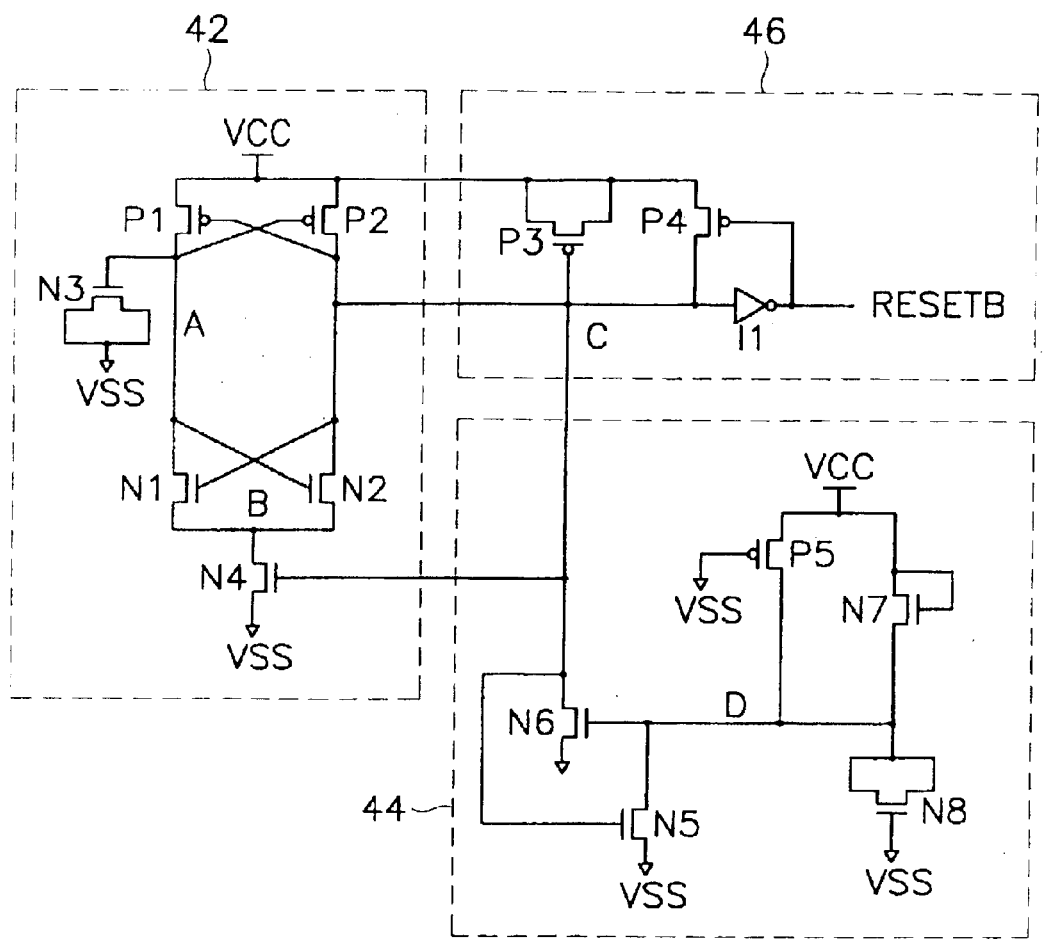
FIG. 8 is a circuit diagram showing a reset circuit in accordance with a preferred embodiment of the present disclosure.

FIG. 8 is a circuit diagram showing a reset circuit 40 in accordance with a preferred embodiment of the present disclosure.

A conventional reset signal rises depending on the power voltage VCC when the power voltage VCC rises the low voltage to the normal voltage. But the conventional reset signal transits to a low level when the power voltage VCC reaches the threshold voltage, and then maintains the low level.

However, the reset circuit 40 of the present disclosure outputs the resetbar signal RESETB to the low voltage detecting synchronization circuit 50. The resetbar signal RESETB is maintained at the low level when power voltage VCC rises from the low voltage to the threshold voltage, and maintained at the high level when the power voltage VCC is over the threshold voltage or falls from the normal to the predetermined level of voltage.

Particularly, the reset circuit 40 applies the resetbar signal RESETB of the low level to the low voltage detecting synchronization circuit 50 when the power voltage rises from the low voltage to the threshold voltage. As a result, an initial chip internal control signal CICS becomes forcibly at the low level.

In more detail, the reset circuit 40 comprises a latch unit 42, a power sensing unit 44 and a pull-up unit 46. The latch unit 42 maintains the level of applied voltage for a predetermined period. The power sensing unit 44 senses the variation of output voltage from the latch unit 42 to regulate the level of the output voltage. The pull-up unit 46 pulls up the output voltages from the latch unit 42 to a high level, inverts signals regulated by the power sensing unit 44 and then outputs the inverted signals into the low voltage detecting synchronization circuit 50.

The latch unit 42 comprises a PMOS transistor P1, a NMOS transistor N1, a PMOS transistor P2, a NMOS transistor N2, a NMOS transistor N3 and a NMOS transistor N4. The PMOS transistor P1 and the NMOS transistor N1 connected in series between a power voltage terminal VCC and a node B have each gate connected to a node C. The PMOS transistor P2 and the NMOS transistor N2 connected in series between a power voltage terminal VCC and a node B have each gate connected to a node A. The NMOS transistor N3 has a drain and source in common connected to a ground voltage terminal VSS and a gate connected to the node A. The NMOS transistor N4 connected between the node B and the ground voltage terminal VSS has a gate connected to the node C.

The power sensing unit 44 comprises a NMOS transistor N5, a NMOS transistor N6, a PMOS transistor P5, a NMOS transistor N7 and a NMOS transistor N8. The NMOS transistor N5 connected between a node D and the ground voltage terminal VSS has a gate connected to the node C. The NMOS transistor N6 connected between the node C and the ground voltage terminal VSS has a gate connected to the node D. The PMOS transistor P5 connected between the power voltage terminal VCC and the node D has a gate connected to the ground voltage VSS. The NMOS transistor N7 connected between the power voltage terminal VCC and the node D has a gate in common connected to the power voltage terminal VCC. The NMOS transistor N8 has a drain and a source in common connected to the node D and a gate connected to the ground voltage terminal VSS.

The pull-up unit 46 comprises a PMOS transistor P3, an inverter I1 and a PMOS transistor P4. The PMOS transistor P3 has a drain and a source in common connected to the power voltage terminal VCC and a gate terminal connected to the node C. The inverter I1 inverts and outputs a output signal of the node C. The PMOS transistor P4 connected between the power voltage terminal VCC and the node C has a gate connected to an output terminal of the inverter I1.

Figure 9:
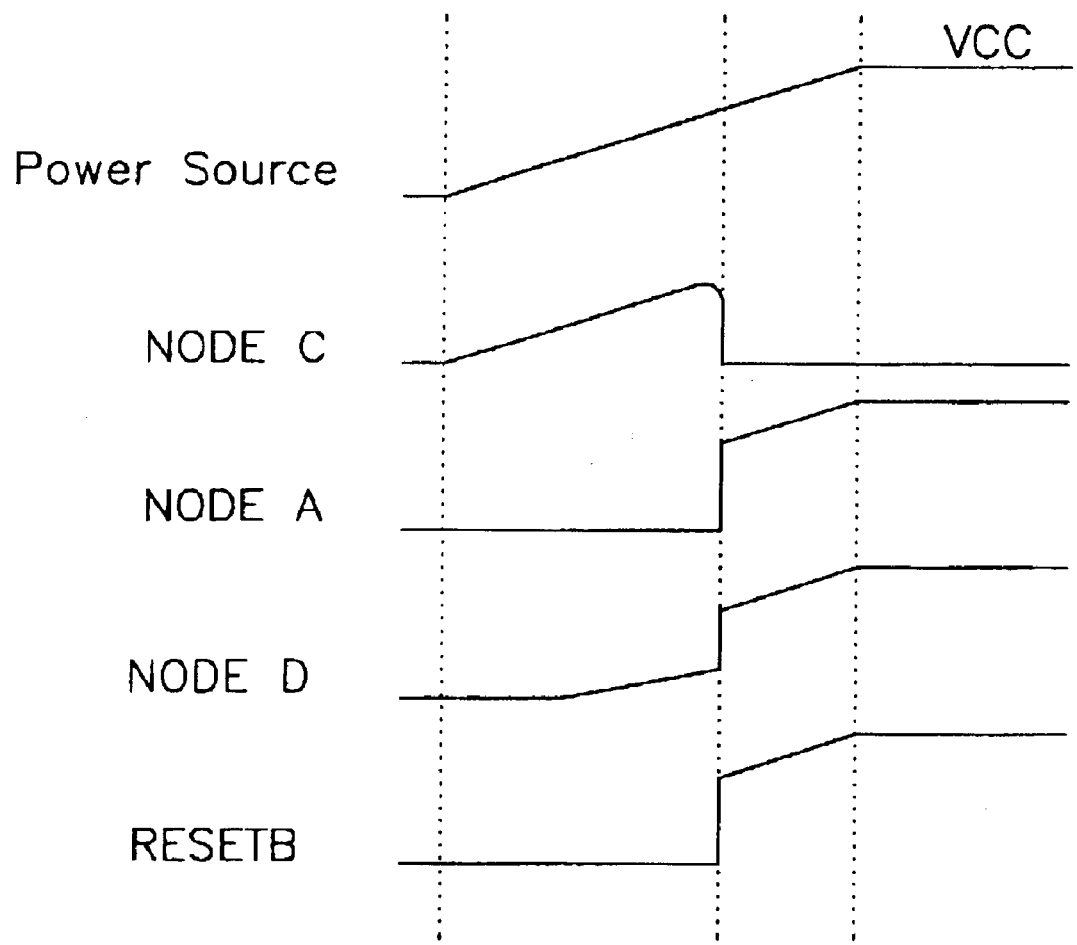
FIG. 9 is a diagram showing operation waveforms of the reset circuit of FIG. 8.

FIG. 9 is a diagram showing operation waveforms of the reset circuit 40. Referring to FIG. 9, while the power voltage VCC rises from the low voltage to the normal voltage, the node A is fixed at the low level by the NMOS transistor N3 and the PMOS transistor P2 is turned on.

As the power voltage VCC increases, current is provided to the node C via the PMOS transistor P2. As a result, the voltage of the node C also increases depending on the increase of the power voltage VCC.

When the voltage of the node C reaches a predetermined level, the NMOS transistor N4 is turned on. Then, the node A becomes at the low level. The NMOS transistor N5 also is turned on, and the node D becomes at the low level.

The node D becomes at the low level initially by the NMOS transistor N8 and then is maintained at the low level by the NMOS transistor N5. As the power voltage VCC gradually increases, the amount of current supplied to the node D via the PMOS transistor P5 and the NMOS transistor N7 also increases. As a result, the voltage level of the node D is determined according to the ratio of the current flowed into the node D via the NMOS transistor N7 and the PMOS transistor P5 to the current sunk via the NMOS transistor N5.

When the voltage of the node D exceeds a predetermined level due to the increase of the current flowing into the node D, the NMOS transistor N6 is turned-on and the node C becomes at the low level. Then, the NMOS transistor N4 of the latch unit 42 is turned-off, and the node A is pulled-up to the high level due to the low level of the node C. Here, because the current to pull up is blocked, the node C continuously is maintained at the low level.

In the power sensing unit 44, the NMOS transistor N5 is turned-off due to the low level of the node C, and then the node D is pulled-up to a power voltage level by the PMOS transistor P5.

As a result, the NMOS transistor N6 continuously maintains the on-state and then the node C is fixed at the low level.

The voltage of the node C is inverted by the inverter I1 and the inverted voltage signal like the resetbar signal RESETBAR of FIG. 9 is applied to the low voltage detecting synchronization circuit 50 of the present disclosure.

Figure 10:
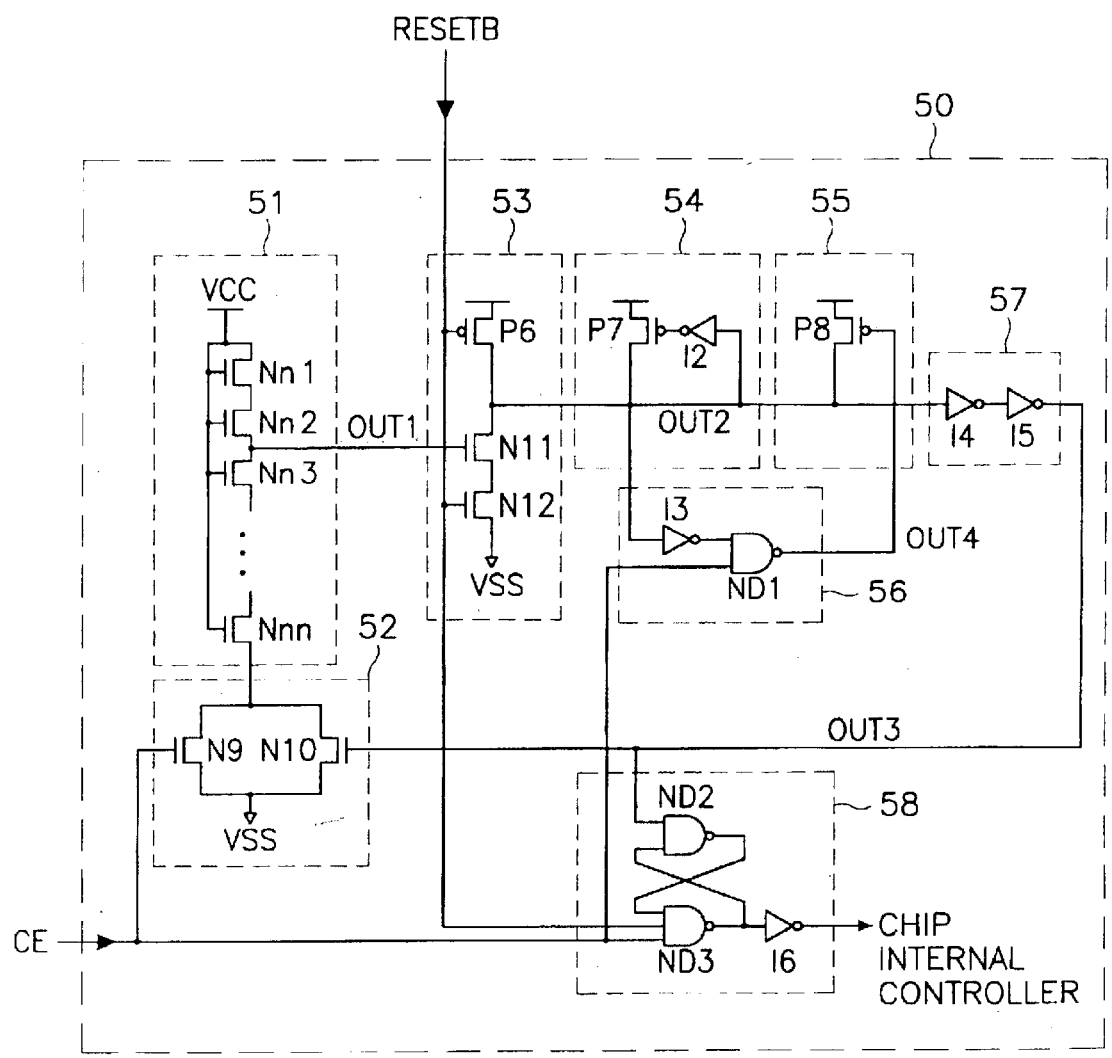
FIG. 10 is a circuit diagram showing the FeRAM driving device in accordance with a preferred embodiment of the present disclosure.

FIG. 10 is a circuit diagram showing the low voltage detecting sychrnonization circuit 50 in accordance with a preferred embodiment of the present disclosure.

The low voltage detecting synchronization circuit 50 comprises a power voltage reducing distribution unit 51, a first signal synchronization unit 52, a low voltage detection unit 53, a first level maintaining unit 54, a second level maintaining unit 55, a control unit 56, a low voltage discrimination unit 57 and a second signal synchronization unit 58. The power voltage reducing distribution unit 51 reduces a power voltage and then outputs the reduced voltage. The first signal synchronization unit 52 synchronizes the output signal of the power voltage reducing distribution 51 to chip activation signal CE. The low voltage detection unit 53 detects whether the power voltage VCC is at the low level according to output signals of the power voltage reducing distribution unit 51 and the resetbar signal RESETB. The first level maintaining unit 54 maintains the output signal of the low voltage detection unit 53 to the high level when the voltage of the low voltage detection unit 53 becomes at the high level. The second level maintaining unit 55 maintains the regulated voltage by the first level maintaining unit 54 not to fall into the low level. The control unit 56 controls the second level maintaining unit 55 according to the output signal from the low voltage detection unit 53 and the chip activation signal. The low voltage discrimination unit 57 discriminates whether the output signal of the low voltage detection unit 53 is low or normal. The second signal synchronization unit 58 outputs chip internal control signals CICS synchronized to chip activation signal CE, by using the resetbar signal RESETB, the output signal of the low voltage discrimination unit 57 and the chip activation signal CE when the power voltage is a normal voltage.

In more detail, the power voltage reducing distribution unit 51 comprises a plurality of NMOS transistors Nn1~Nnn connected in series between the power voltage terminal VCC and the first signal synchronization unit 52 and having each gate connected to the power voltage terminal VCC in common.

The first signal synchronization unit 52 comprises a NMOS transistor N9 and a NMOS transistor N10 connected in parallel between the power voltage reducing distribution unit 51 and the ground voltage VSS. THe chip activation signal CE is applied to the gate of the NMOS transistor N9, and an output signal of the low voltage discrimination unit 57 is applied to the gate of the NMOS transistor N10.

The power voltage reducing distribution unit 51 outputs signals synchronized to the chip enable signal CSBPAD according to variation of power voltage by the first signal synchronization unit 52.

Particularly, the first signal synchronization unit 52 helps the power voltage reducing distribution unit 51 to output different waveforms according to output signals of the low voltage discrimination unit 57. As a result, memory operations may be accurately discriminated from a low and a normal voltage regions and then controlled.

The low voltage detection unit 53 comprises a PMOS transistor P6, a NMOS transistor N11 and a NMOS transistor N12. The PMOS transistor P6 is connected between the power voltage VCC and a node OUT2. The resetbar signal RESETB is applied to the gate of the PMOS transistor P6. The NMOS transistor N11 and the NMOS transistor N12 are connected in series between the node OUT2 and the ground voltage terminal. A signal of the node OUT1 and the resetbar signal RESETB are applied to each gate terminal of the NMOS transistor N11 and the NMOS transistor N12.

The low voltage detection unit 53 outputs a signal of the high level when the power voltage VCC is in the low voltage, while it outputs the signal of the low level when the power voltage is in the normal voltage.

The first level maintaining unit 54 comprises an inverter I2 and a PMOS transistor P7. The inverter I2 inverts an output signal of the low voltage detection unit 53. The PMOS transistor P7 connected between the power voltage VCC and the node OUT2 is turned-on/off according to the output signal of the inverter I2.

The first level maintaining unit 54 operates only when the output signal of the low voltage detection unit 53 is at the high level, not at the low level, and then maintains a voltage of the node OUT2 to the high level.

The second level maintaining unit 55 comprises a PMOS transistor P8 connected between the power voltage VCC and the node OUT2 and having a gate connected to a node OUT4.

The first and the second level maintaining units 54 and 55 prevents the node OUT2 of the high level from becoming at the low level according to the lapse of time.

The control unit 56 comprises an inverter I3 and a first logic device ND1. The inverter I3 inverts an output signal of the PMOS transistor P7. The first logic device ND1 logically operates using an output signal of a inverter I4 and a chip activation signal CE as an input signal and then outputs the logic operation result into a gate of the second level maintaining unit 55.

In other words, when the chip activation signal CE becomes at the high level and an output of the low voltage detection unit 53 becomes at the low level, an output signal of the control unit 56 becomes at the low level, to enable the second level maintaining unit 55. As a result, current is supplied to the node OUT2.

In a normal voltage, the amount of current sunk via the NMOS transistor N12 is larger than that of supplied via the second level maintaining unit 55. AS a result, the voltage of the node OUT2 is held at the low level.

The low voltage discrimination unit 57 comprises an inverter I4 and inverter I5 connected in series. The inverter I4 inverts an output signal of the low voltage detection unit 53, and the inverter I5 inverts a output signal of the inverter I4.

Each voltage of the nodes OUT2 and OUT3 is at the high level when a power voltage is in the low voltage region, while it is at the low level when the power voltage is in the normal voltage region.

The second signal synchronization unit 58 comprises a second logic device ND2, a third logic device ND3 and an inverter I6. The second and the third logic devices ND2 and ND3 have a latch structure. The inverter I6 inverts an output signal of the third logic device ND3 and then outputs a chip internal control signal CICS into a chip internal controller for FeRAM cell operation.

An output of the low voltage discrimination unit 57 and an output of the third logic device ND3 are inputted into the second logic device ND2. Then, an output signal outputted from the second logic device ND2 is inputted into one of the input terminals of the third logic device ND3. a chip activation signal CE, a resetbar signal RESETB and an output of the second logic device ND2 are inputted into the third logic device ND3. Then, an output signal outputted from the third logic device ND3 is inputted into the second logic device NAND2 and the inverter I6. The inverter I6 inverts an output of the third logic device ND3 and then outputs a internal chip control signal CICS.

Here, by applying the resetbar signal RESETB outputted from the reset circuit 40 into one of the input terminals of the third logic device ND3, the chip internal control signal CICS is maintained at the low level during the initial operation regardless of the state of the chip activation signal CE or the output signal of the low voltage discrimination unit 57.

Figure 11:
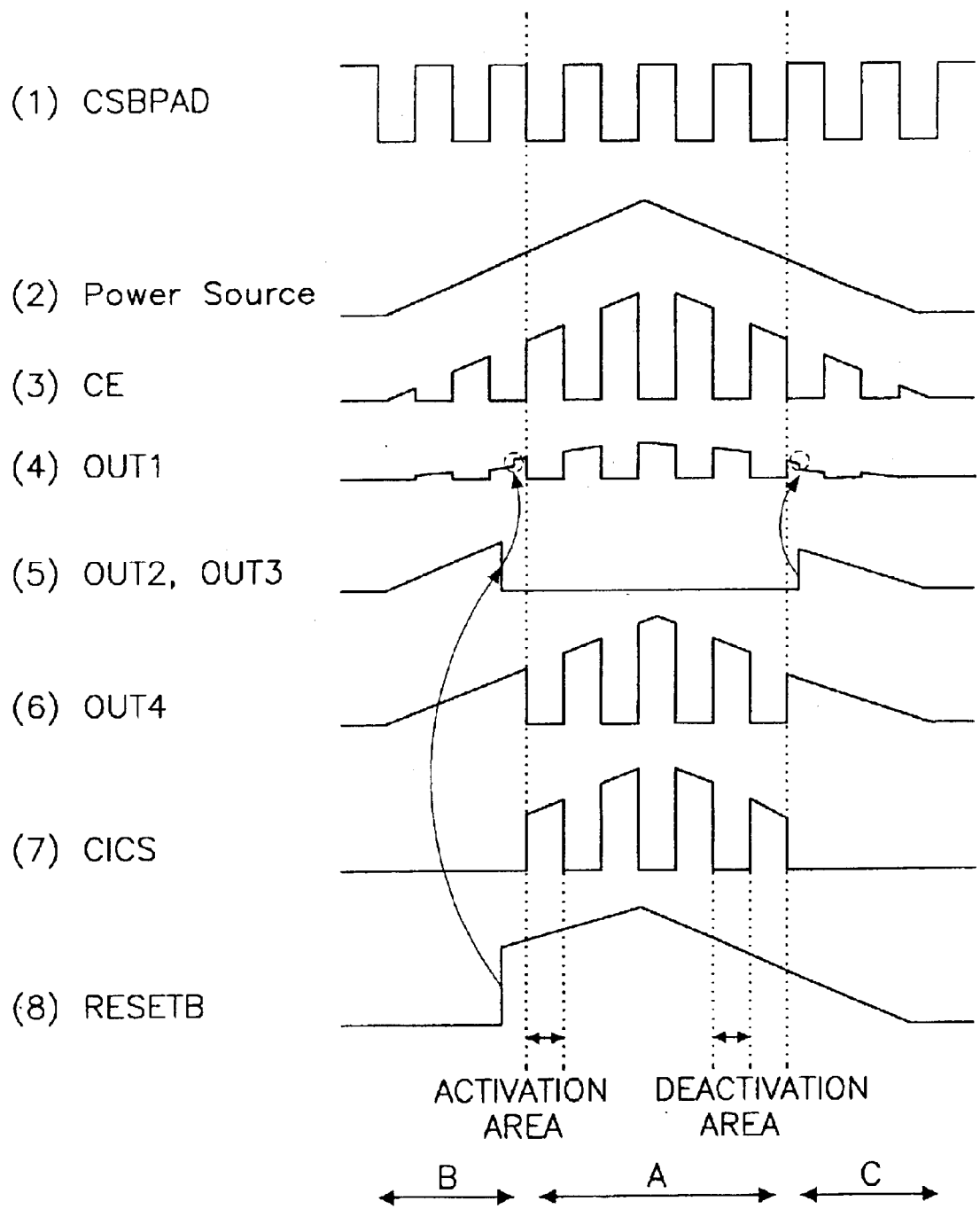
FIG. 11 is a diagram showing operation waveforms of the FeRAM driving device of FIG. 10.

FIG. 11 is a timing diagram showing the operation of the low voltage detecting synchronization circuit of FIG. 10. Referring to this FIG. 11, the operations are explained wherein a chip internal control signal CICS is held at the low level in the low voltage region and synchronized to a chip activation signal CE in the normal voltage region.

In a section A, a power voltage is a normal voltage. In sections B and C, the power voltage is a low voltage. The dotted line represents a threshold value of the power voltage VCC wherein a memory cell operates or stops.

The waveform of the chip activation signal CE varies having the opposite phase to the external signal CSBPAD according to variation of the power voltage VCC.

When the power voltage VCC is turned-on, that is, the power voltage gradually rises from the low voltage to the normal voltage (section B), the voltage of the node OUT2 gradually increases by the PMOS transistor P6, as shown in the wave form (5), during the interval wherein the resetbar signal RESETB is maintained at a low level. The voltage of the node OUT3 also increases gradually by the output signal of the low voltage discrimination voltage 57 and is maintained at the high level.

The power voltage reducing distribution unit 51 is synchronized to the external signal CSBPAD by the operation of the first signal synchronization unit 52 and then reduces the power voltage at a predetermined ratio to output the voltage into the node OUT1.

The power voltage reducing distribution unit 51 outputs a signal of lower level when the external signal CSBPAD is enabled while outputting a signal of higher level when the external siganl CSBPAD is disabled. Here, the external siganl CSBPAD is enabled at a low level while disabled at a high level.

The first level maintaining unit 54 is continuously maintained at the high level when the voltage of the node OUT2 is at a high level but does not operate at a low level.

Because the voltage of the node OUT2 is held at a high level in the section B, the control unit 56 outputs a signal of high level into the node OUT4 regardless of the state of the chip activation signal CE. As a result, the second level maintaining unit 55 does not operate.

The second signal synchronization unit 58 outputs a chip internal control signal CICS of low level regardless of the state of the chip activation signal CE due to the resetbar signal RESETB held at a low level when the power voltage increases to a predetermined level. Here, the initial state of the chip internal control signal CICS is forcibly at a low level.

When the power voltage VCC fully increases to a predetermined level, the resetbar signal RESETB is transited to the high level by the power sensing unit 44 of the reset circuit 40. As a result, the PMOS transistor P6 of the low voltage detection unit 53 is turned-off and the NMOS transistor N12 is turned-on. The nodes OUT2 and OUT3 transits from the high level to the low level.

While the node OUT3 transits from the high level to the low level, the NMOS transistor N10 of the first signal synchronization unit 52 is turned-off and the voltage reduction of the power voltage VCC by the first signal synchronization unit 52 suddenly decreases. As a result, the output waveform of the power voltage reducing distribution unit 51 varies into a differentiated waveform (small dotted circle in the waveform (4) of FIG. 11) just before the normal voltage region (section A). The first signal synchronization unit 52 can discriminate definitely between a low and a normal voltage regions and control operation.

When the node OUT2 is transited to a low level, the second level maintaining unit 55 is synchronized to a chip activation signal CE by an output signal of the control unit 56 and then supplies current to the node OUT2. However, the voltage of the node OUT2 may be maintained at a low level in the normal voltage region (section A), as shown in the waveform (5) because the current outflow by the NMOS transistor N4 is larger than the current supply by the second level maintaining unit 55.

Since the node OUT3 is maintained at a low level before the operation start point of the memory cell, the second logic device ND2 of the second signal synchronization unit 58 outputs a signal of high level into one of the input terminals of the third logic device ND3.

Since the two input signals (resetbar signal RESETB, signal outputted from the second logic device Nd2) of three input signals of the third logic device ND3 are at high levels, the third logic device ND3 is synchronized at the chip activation signal CE, the rest input signal, and then outputs an inverted chip enable signal. The inverter I6 re-inverts the inverted chip enable signal and outputs the chip internal control signal CICS for activating the memory cell.

In the normal voltage region (section A), the node OUT3 is held at a low level and the resetbar signal RESETB is held at a high level. As a result, the second signal synchronization unit 58 outputs a chip internal control signal CICS synchronized to the chip activation signal CE.

In this way, although the power voltage VCC is not synchronized with the chip enable signal due to variation of the VCC and reaches a threshold value for operation start of the memory cell, the chip internal control signal CICS for enabling the memory cell is not right generated but synchronized to a chip enable signal and then generated.

Next, the power voltage VCC falls from a normal to a low voltage region and reaches the operation stop point of the memory cell like the off-state of the power voltage VCC. Then, the chip activation signal CE is transited from a high to low level, and the resetbar signal RESETB also falls. As a result, the NMOS transistor N12 of the low voltage detection unit 53 is turned-off and the PMOS transistor P6 is turned-on.

As shown in the waveform (5) of the section C, the voltage of the nodes OUT2 and OUT3 are re-transited to a high level. Here, since the chip internal control signal CICS is at a low level, the second logic device ND2 outputs a signal of low level.

As a result, the third logic device ND3 outputs a signal of high level regardless of the states of the chip activation signal CE and the resetbar signal RESETB because the output from the second logic device ND2 is at a low level. the chip internal control signal CICS is tansited to a low level.

The second signal synchronization unit 58 formed of the latch circuit outputs a chip internal control signal CICS fixed at a low level regardless of the state of the chip activation signal CE in the section C because the node OUT3 and the output of the third logic device ND3 are fixed at high levels.

In this way, although the power voltage VCC is not synchronized with the chip enable signal due to variation of the VCC and reaches a threshold value for operation stop of the memory cell, the second signal synchronization unit 58 does not right generate the chip internal control signal CICS of low level for disabling the memory cell but synchronizes the chip internal control signal CICS to a chip enable signal and then generates the signal.

The voltage of the node OUT3 is transited to a high level and then the NMOS transistor N2 is turned-on. As a result, the power voltage VCC is instantly reduced to a considerable degree by the first signal synchronization unit 52 in the normal voltage region (section A). The output waveform of the node OUT1 varies differentially as shown in the above-described section B.

However, the voltage of the node OUT2 and OUT3 at the point wherein the voltage of the nodes OUT2 and OUT3 is re-transited to a high level in the section C (operation stop point) is lower than that of the operation start point in the section B. As a result, the degree of voltage variation by the NMOS transistor N2 in the section C is smaller than that in the section A.

The voltage of the node OUT4 is maintained at a high level regardless of the state of the chip activation signal CE because the voltage of node OUT2 is transited to a high level in the section C. As a result, the second level maintaining unit 55 is turned-off.

The chip internal control signal CICS is fixed at a low level in the low voltage regions (sections B and C), and the memory cell does not operate. In the normal voltage region (section A), the chip internal control signal CICS is synchronized to the chip activation signal CE to activate the memory cell. As a result, the activation voltage area and the deactivation voltage area are definitely discriminated.

Figure 12:
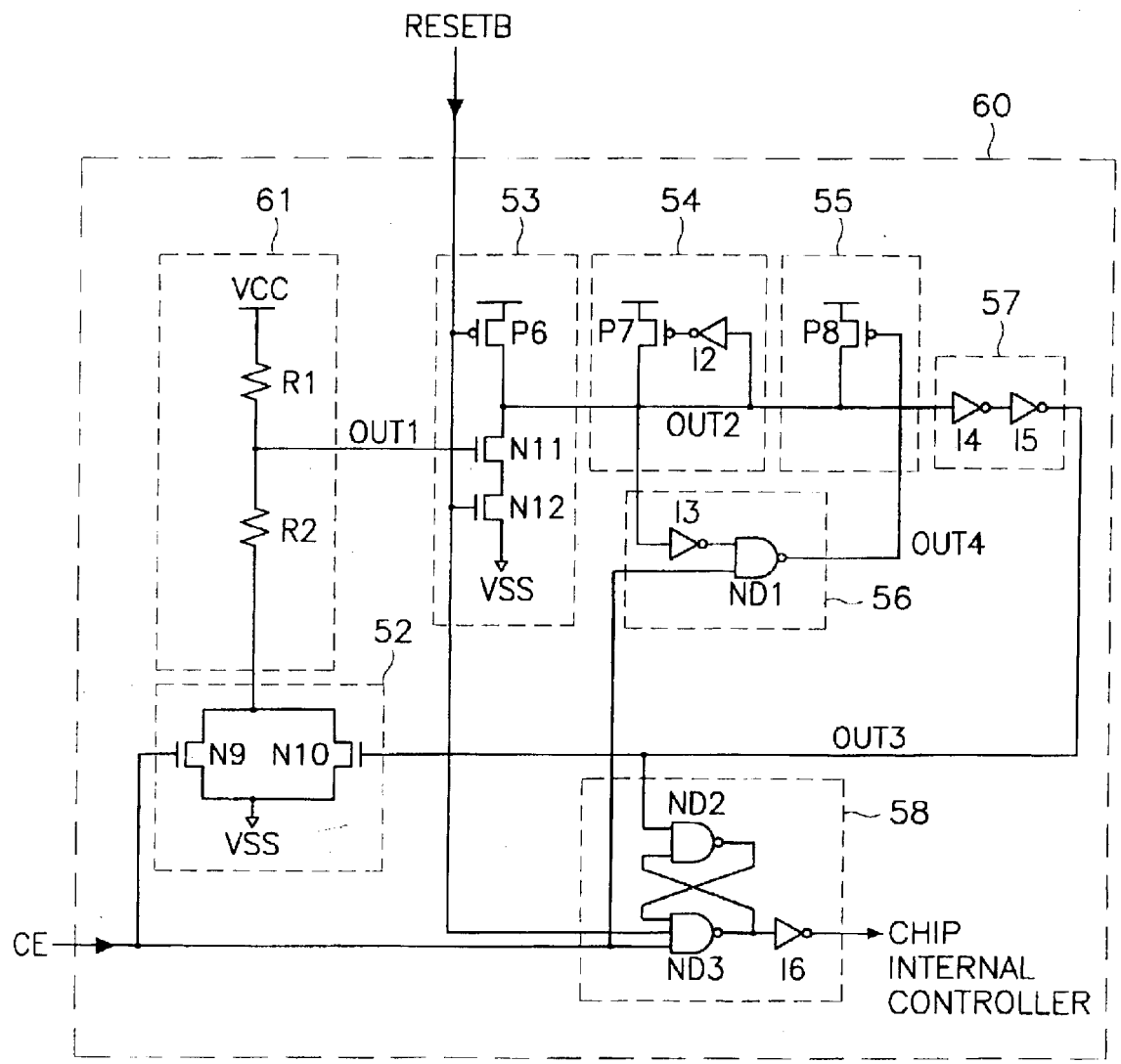
FIG. 12 is a circuit diagram showing a FeRAM cell driving device in accordance with another preferred embodiment of the present disclosure.

FIG. 12 is a diagram showing the low voltage detecting synchronization circuit in accordance with another preferred embodiment of the present disclosure.

In another preferred embodiment, a power voltage reducing distribution unit 61 comprises a plurality of resistors R1 and R2 instead of a plurality of NMOS transistors. The plurality of resistors R1 and R2 are connected in series between a power voltage VCC and a first signal synchronization unit 72.

The low voltage detecting synchronization circuit of FIG. 12 has the same structure and operation with that of FIG. 10 except using the resistors R1 and R2 for reducing and outputting the power voltage. Accordingly, the detail explanation is omitted.

AS discussed earlier, the FeRAM cell driving device and the method thereof do not right generate a chip internal control signal CICS for operating the memory cell although a power voltage reaches a threshold value for operation start or stop of the memory cell in the non-synchronized state with a chip enable signal due to variation of the power voltage such as on-off states, but synchronizes the chip internal control signal CICS to the chip enable signal and then generates the signal. As a result, the operation start and stop points according to variation of power voltage are definitely discriminated into a chip activation voltage area and a deactivation voltage area, thereby securing the safe operation of the memory cell in a threshold voltage area.

Additionally, the layout area of the chip becomes efficient without having additional circuits.

What is claimed is:

1. A low voltage detector for nonvolatile FeRAM chips, characterized in that a chip internal control signal is fixed to a low level by using an external resetbar signal before a power voltage reaches a threshold value for operation start of FeRAM cells regardless of change in chip activation signals, wherein the chip internal control signal of the low level leads to forcibly disable the memory cell.

2. A low voltage detector for nonvolatile FeRAM chips, comprising:

a reset circuit for outputting a resetbar signal maintained at a low level until a power voltage reaches a predetermined level when a power voltage rises from the low voltage to a normal voltage, and maintained at a high level when power voltage is in the normal voltage or falls from the normal voltage to the predetermined level; and a low voltage detecting synchronization circuit for synchronizing start and stop operation of nonvolatile memory cell to a chip activation signal, by detecting variation in the resetbar signal and power voltage.

3. The low voltage detector according to claim 2, wherein the low voltage detecting synchronization circuit, depending on the variation of the resetbar signal and the power voltage, disables the memory cell synchronized to the chip activation signal when the power voltage is at the low voltage, and enables the memory cell when the power voltage is at the normal voltage.

4. The low voltage detector according to claim 2, wherein the reset unit comprises:

a latch unit for maintaining the level of applied voltage for a predetermined period;

a power sensing unit for sensing the variation of power voltage via output voltage from the latch unit to regulate the level of the voltage;

a pull-up unit for pulling-up output voltage of the latch unit and inverting a regulated voltage by the power sensing unit to output the inverted signal into the low voltage detecting synchronization circuit.

5. The low voltage detector according to claim 2, wherein the low voltage detecting synchronization circuit comprises:

a power voltage reducing distribution unit for reducing power voltage at a predetermined rate to output the reduced power voltage;

a first signal synchronization unit for synchronizing the variation of output signals for the power voltage reducing distributor to a chip enable signal;

a low voltage detection unit for detecting whether the power voltage is at the low level, according to output signal of the power voltage reducing distribution unit and resetbar signal of the reset unit;

a low voltage discrimination unit for discriminating whether output signal of the low voltage detection unit is at the low level or at the normal level; and a second signal synchronization unit, synchronized to the chip activation signal, for outputting a chip internal control signal when the power voltage is at the normal voltage.

6. The low voltage detector according to claim 5, wherein the second signal synchronization unit outputs the chip internal control signal, synchronized to the chip activation signal, according to logic combination of the resetbar signal, the output signal of the low voltage discrimination unit and the chip enable signal when the power voltage is at the normal level.

7. The low voltage detector according to claim 5, further comprising a level maintaining unit for maintaining the level of the output signals from the low voltage detection unit, regardless of the lapse of time.

8. The low voltage detector according to claim 7, wherein the level maintaining unit further comprises:

a first level maintaining unit for maintaining output signals from the low level detection unit to the high level;

a second level maintaining unit for maintaining the voltage regulated by the first level maintaining unit not to fall into a low level; and a control unit for controlling the second level maintaining unit according to the output signals of the low voltage detection unit and the chip activation signal.

9. The low voltage detector according to claim 5, wherein the power voltage reducing distribution unit comprises a plurality of switching devices or resistors connected in series between the power voltage unit and the first signal synchronization unit.

10. A low voltage detector for nonvolatile FeRAM chips, comprising:

a system controller for outputting a chip enable signal to read/write record data from/to the memory;

a buffer for inverting the chip enable signal and outputting a chip activation signal; and a memory driving device for receiving the chip activation signal and then generating chip internal control signals for operating the memory by synchronizing the chip internal control signals to the chip activation signal when a power voltage is at a normal level.

11. The low voltage detector according to claim 10, wherein the memory driving device comprises:

a reset unit for outputting a resetbar signal maintained at a low level until the power voltage reaches a predetermined level when the power voltage rises from the low level to a normal level, and maintained at a high level when the power voltage is at the normal level or falls from the normal level to the predetermined level; and a low voltage detecting synchronization circuit for synchronizing start and stop operation of nonvolatile memory cell to the chip activation signal, by detecting variation in the resetbar signal and power voltage.

12. The low voltage detector according to claim 11, wherein the reset unit comprises:

a latch unit for maintaining the level of applied voltage for a predetermined period;

a power sensing unit for sensing the variation of power voltage via output voltage from the latch unit to regulate the level of the voltage;

a pull-up unit for pulling up output voltage of the latch unit to high level and inverting a regulated voltage by the power sensing unit to output the signals.

13. The low voltage detector according to claim 11, wherein the low voltage detecting synchronization circuit, depending on the variation of the resetbar signal and the power voltage, disables the memory cell when the power voltage is at the low voltage, and enables the memory cell synchronized to the chip activation signal when the power voltage is at the normal voltage.

14. The low voltage detector according to claim 11, wherein the low voltage detecting synchronization circuit forcibly disables the memory cell by fixing a chip internal control signals at low level using the resetbar signal before the power voltage reaches a threshold level for operating the memory cell, and wherein to fix the chip internal control signal is regardless of the variation of chip activation signal.

15. The low voltage detector according to claim 11, wherein the low voltage detecting synchronization circuit comprises:

a power voltage reducing distribution unit for reducing power voltage at a predetermined rate to output the reduced power voltage;

a first signal synchronization unit for synchronizing the variation of output signals for the power voltage reducing distributor to a chip enable signals;

a low voltage detection unit for detecting whether the power voltage is at the low level, according to output signals of the power voltage reducing distribution unit and resetbar signals of the reset unit;

a low voltage discrimination unit for discriminating whether output signal of the low voltage detection unit is at the low level or at the normal level; and a second signal synchronization unit, synchronized to the chip activation signal, for outputting a chip internal control signal when the power voltage is at the normal voltage.

16. The low voltage detector according to claim 15, wherein the second signal synchronization outputs the chip internal control signal synchronized to the chip activation signals according to logic combination of the resetbar signal, the output signal of the low voltage discrimination unit and the chip enable signal when the power voltage is in a normal voltage level.

17. The low voltage detector according to claim 15, further comprising a level maintaining unit for maintaining the level of the output signals from the low voltage detection unit, regardless of the lapse of time.

18. The low voltage detector according to claim 17, wherein the level maintaining unit further comprises:

a first level maintaining unit for maintaining output signals from the low voltage detection unit to the high level;

a second level maintaining unit for maintaining the voltage regulated by the first level maintaining unit not to fall into low level; and a control unit for controlling the second level maintaining unit according to the output signals of the low voltage detection unit and the chip activation signals.

19. The low voltage detector according to claim 15, wherein the power voltage reducing distribution unit comprises a plurality of switching devices or resistors connected in series between the power voltage unit and the first signal synchronization unit.

* * * * *